(12) United States Patent
Lin et al.

(10) Patent No.: US 8,059,341 B2
(45) Date of Patent: Nov. 15, 2011

(54) LENS ASSEMBLY AND METHOD FOR FORMING THE SAME

(75) Inventors: Tzy-Ying Lin, Hsinchu (TW); Chieh-Yuan Cheng, Hsinchu (TW)

(73) Assignees: VisEra Technologies Company Limited, Hsinchu (TW); OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/565,325

(22) Filed: Sep. 23, 2009

(65) Prior Publication Data

US 2011/0069395 A1 Mar. 24, 2011

(51) Int. Cl.
*G02B 27/10* (2006.01)
(52) U.S. Cl. ........................ 359/620; 359/622
(58) Field of Classification Search ............ 359/619–622
See application file for complete search history.

(56) References Cited

U.S. PATENT DOCUMENTS

| | | | |
|---|---|---|---|
| 6,625,864 B2 * | 9/2003 | Nemoto et al. | 359/621 |
| 6,894,840 B2 * | 5/2005 | Yamanaka et al. | 359/619 |
| 2006/0044450 A1 | 3/2006 | Wolterink et al. | |
| 2007/0166029 A1 | 7/2007 | Lee et al. | |
| 2009/0225431 A1 * | 9/2009 | Lee | 359/621 |

* cited by examiner

*Primary Examiner* — Alicia M Harrington
(74) *Attorney, Agent, or Firm* — Muncy, Geissler, Olds & Lowe, PLLC

(57) ABSTRACT

According to embodiments of the invention, a lens assembly and method for forming the same is provided. The method includes providing a first lens layer having a first transparent substrate and a first lens on the first transparent substrate, providing a second lens layer having a second transparent substrate and a second lens on the second transparent substrate, forming a spacer structure between the first lens layer and the second lens layer, and thinning the first transparent substrate to a first thickness after the spacer is formed.

18 Claims, 5 Drawing Sheets

LENS ASSEMBLY AND METHOD FOR FORMING THE SAME

BACKGROUND OF THE INVENTION

1. Field of the Invention

The present invention relates to a lens assembly and method for forming the same, and in particular relates to a lens assembly having an accurate and precise focal length.

2. Description of the Related Art

Electronic imaging devices are used in a wide range of applications, such as digital cameras, digital video recorders, image capture capable mobile phones and monitors. Electronic imaging devices, such as image sensor modules, typically convert light to electrical signals using a photodetector. Typically, an electronic imaging device includes an image sensor chip and an optical lens assembly, which is used to project an object onto the image sensor chip. Thus, the quality of the image projection of the optical lens assembly determines the quality of the image signal processed by the image sensor chip. If the optical lens assembly can not focus a projected image onto the image sensor chip precisely, an "out-of-focus" problem will occur, thereby degrading image quality.

Accordingly, a lens assembly having an accurate and precise focal length is desired.

BRIEF SUMMARY OF THE INVENTION

According to an illustrative embodiment, a method for forming a lens assembly is provided. The method includes providing a first lens layer having a first transparent substrate and a first lens on the first transparent substrate, providing a second lens layer having a second transparent substrate and a second lens on the second transparent substrate, stacking the first lens layer on the second lens layer, forming a spacer structure between the first lens layer and the second lens layer, and thinning the first transparent substrate to a first thickness after the spacer structure is formed.

According to another illustrative embodiment, a lens assembly is provided. The lens assembly includes a first lens layer having a first transparent substrate and a first lens on the first transparent substrate, a second lens layer having a second transparent substrate and a second lens on the second transparent substrate, and a spacer structure between the first lens layer and the second lens layer, wherein the spacer structure directly contacts with the first transparent substrate and the second transparent substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many difference embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

Figure 1:
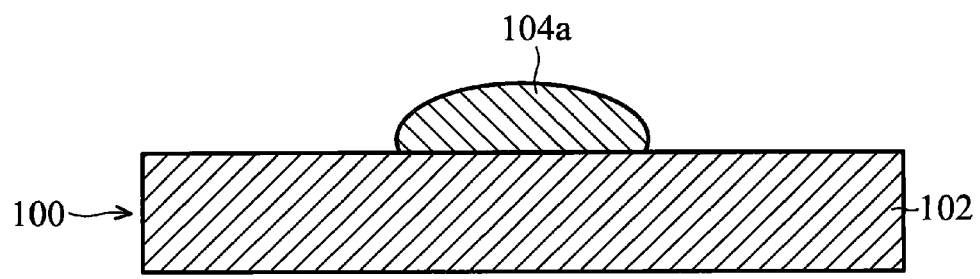
FIGS. 1-8 are cross-sectional views showing the steps of forming a lens assembly in accordance with an embodiment of the present invention.

FIGS. 1-8 are cross-sectional views showing the steps of forming a lens assembly according to an embodiment of the present invention. Referring to FIG. 1, a lens layer 100 having a transparent substrate 102 and a lens 104a on the transparent substrate 102 is provided. The transparent substrate 102 may include a glass substrate, quartz substrate, transparent polymer substrate, or the like. The lens 104a may include a transparent material, such as a transparent resin. The lens 104a may be formed on the transparent substrate 102 by, but is not limited to, a lens mounting process. It should be appreciated that the shape or the configuration of the lens 104a is not limited to the specific type shown in FIG. 1. In another embodiment, the lens has a shape or a configuration different from that shown in FIG. 1. Depending on the requirement, the shape or the configuration of the lens may be modified.

Figure 2:
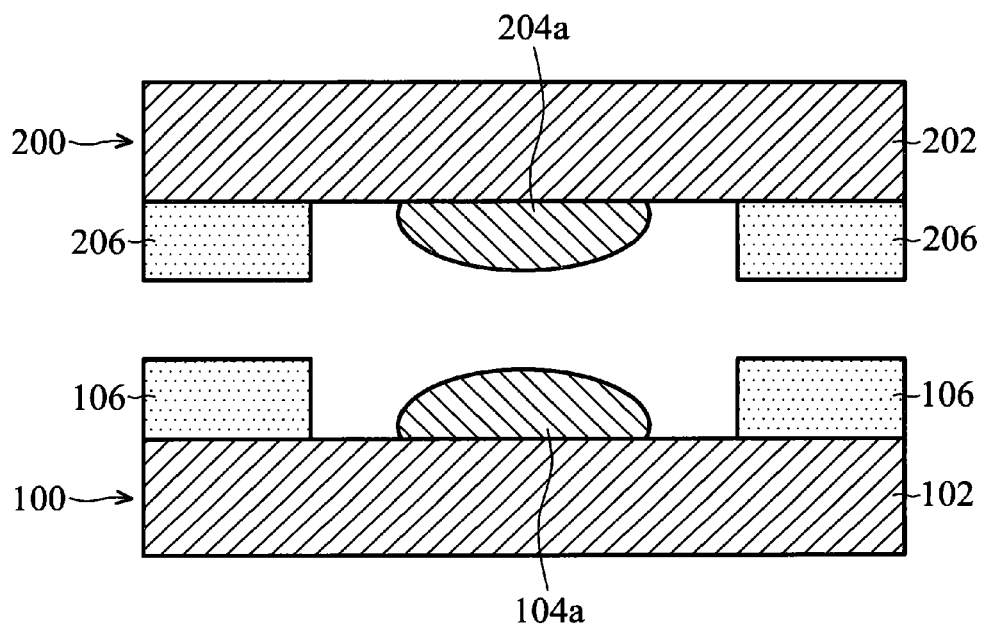

Referring to FIG. 2, a lens layer 200 having a transparent substrate 202 and a lens 204a on the transparent substrate 202 is provided. The lens layers 200 and 100 may be similar or the same. The lens layer 200 is stacked on the lens layer 100 in a subsequent stacking process. A spacer structure is formed between the lens layers 100 and 200 for bonding. In one embodiment, the spacer structure may be formed by bonding two spacer layers respectively formed on the lens layer 100 and the lens layer 200.

For example, as shown in FIG. 2, a spacer layer 106 is formed directly on the transparent substrate 102 of the lens layer 100. Similarly, a spacer layer 206 is also formed directly on the transparent substrate 202 of the lens layer 200. In one embodiment, each of the spacer layers 106 and 206 comprises a polymer material, which is capable of being patterned by a photolithography process and capable of clinging to a substrate, such as a silicon substrate or glass substrate. For example, each of the spacer layers 106 and 206 may comprise Epoxy resin, Silicone resin, Acrylic resin, photo initiator or combinations thereof.

In one embodiment, a spacer layer (not shown) is formed directly on the transparent substrate 102 of the lens layer 100 by, for example a spin coating process, spray coating process, or lamination process. Then, the spacer layer is partially removed by a photolithography process, thereby patterning the spacer layer 106. In the embodiment shown in FIG. 2, the spacer layer 106 does not contact with the lens 104a. The spacer layer 206 is also formed directly on the transparent substrate 202 of the lens layer 200 without contacting with the lens 204a. In some cases, the spacer layer may not be patterned successfully. For example, the spacer layer may be covering an unsuitable portion, such as a portion of the lens. Then, a rework process may be performed to remove the spacer layer by a suitable solvent, such as PGMEA. After the spacer layer is removed, a new spacer layer is formed. Due to the reworkable characteristic of the spacer layer, the line yield of the lens assembly is improved. In addition, the thicknesses of the spacer layers 106 and 206 are adjustable, depending on the requirement. For example, the parameter of the deposition process of the spacer layer may be tuned to make the spacer layer have a suitable thickness.

Then, as shown in FIG. 2, the lens layers 100 and 200 are aligned with each other, and the spacer layer 106 on the transparent substrate 102 is aligned with the spacer layer 206 on the transparent substrate 202. Because both the spacer layers 106 and 206 include a clinging polymer material, the spacer layers 106 and 206 are suitable for bonding with other structure. It is not necessary to apply an adhesive or glue between the bonding interface of the spacer layers 106 and 206. It should be understood by one skilled in the art that there is about a more than 20% error in the thickness control of an adhesive. Thus, if an adhesive is not used during the stacking of the lens layers 100 and 200, the distance between the lenses 104a and 204a can be precisely controlled. As the distance between the lenses 104a and 204a is precisely controlled, the lenses 104a and 204a may focus a projected image precisely, thus improving the image projection quality of the lens assembly.

Figure 3:
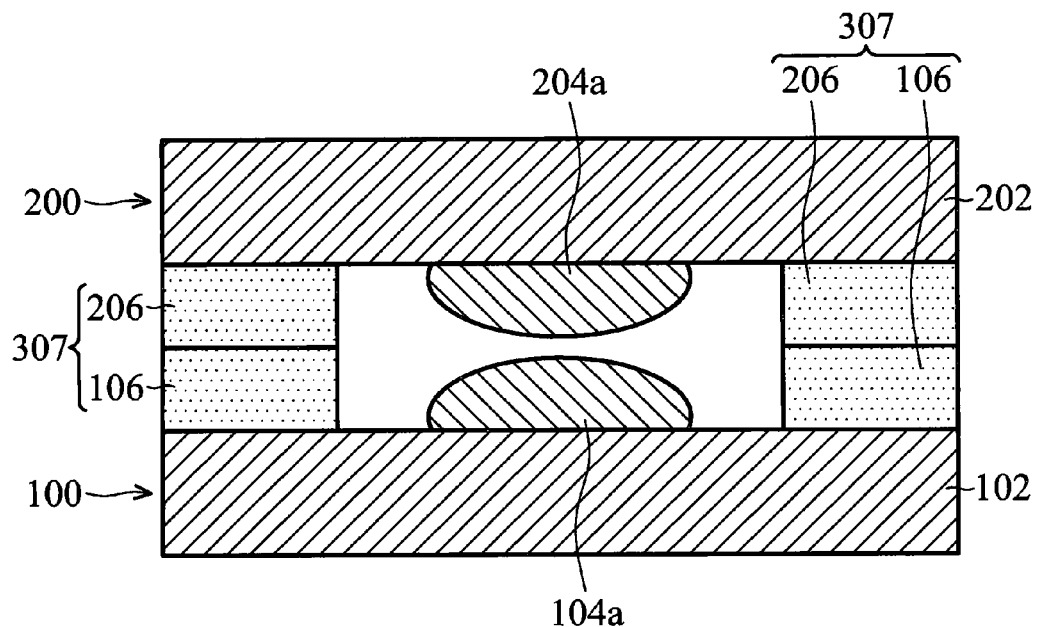

Referring to FIG. 3, the lens layers 100 and 200 are oppositely stacked through the spacer layers 106 and 206. As mentioned above, due to the clinging characteristics of the spacer layers 106 and 206, the spacer layers 106 and 206 are directly bonded together. The bonded spacer layers 106 and 206 together form a spacer structure 307. Thus, the spacer structure 307 is formed between the lens layers 100 and 200, wherein the spacer structure 307 directly contacts with the transparent substrates 102 and 202. As mentioned above, because the spacer structure is not contacting with an adhesive, the distance between the lenses 104a and 204a can be precisely controlled, thus improving the image projection quality of the lenses. In addition, by controlling the thickness of the spacer structure, the focal length of the lens assembly is adjustable.

In one embodiment, after the spacer layers 106 and 206 are bonded, a curing process is performed to harden the spacer layers 106 and 206, thus forming a hardened spacer structure 307. The curing process may be performed at about 100° C. to 200° C. for about 30 minutes to 3 hrs. In addition, the spacer layers 106 and 206 are preferably removable before the curing process. Thus, a rework process may be performed if needed. For example, the spacer layers 106 and 206 may be capable of being removed by a suitable solvent before cured. In some cases, the stacking of the lens layers 100 and 200 may not be successful. A misalignment or similar problem may occur. In these situations, a rework process may be performed before the curing of the spacer layers 106 and 206 since the spacer layers 106 and 206 remain removable before curing. For example, the spacer layers 106 and 206 may be removed by a suitable solvent before the spacer layers 106 and 206 are cured. Then, new spacer layers are formed, followed by a new stacking process, ensuring successful stacking of the lens layers 100 and 200.

Figure 4:
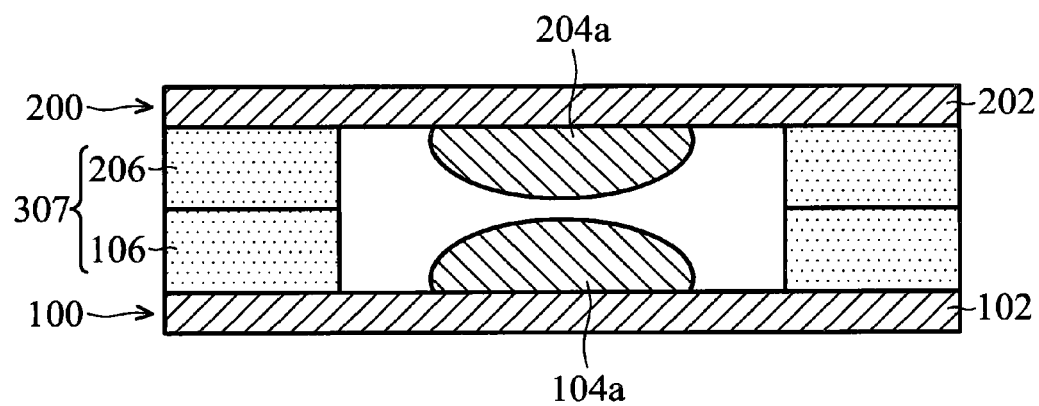

Referring to FIG. 4, the transparent substrate 102 of the lens layer 100 is thinned to a predetermined thickness to tune the focal length of the lens layer 100. The transparent substrate 102 may be thinned by a grinding process or a chemical mechanical polishing process. In one embodiment, an optical test may be performed to determine the desired thickness of the transparent substrate 102. The transparent substrate 202 of the lens layer 200 may also be thinned to a predetermined thickness. For example, in the embodiment shown in FIG. 4, the transparent substrate 202 of the lens layer 200 is also thinned. Although the transparent substrates 102 and 202 shown in FIG. 4 are both thinned to substantially the same thicknesses, the embodiment of the invention is not limited to the specific example. In another embodiment, after the thinning process, the transparent substrate 102 of the lens layer 100 may have a thickness other than that of the transparent substrate 202 of the lens layer 200. Through the thinning process of the transparent substrate, the focal length of the lens layer may be tuned accordingly so that the image projection quality of the lens layer can be improved.

Figure 5:
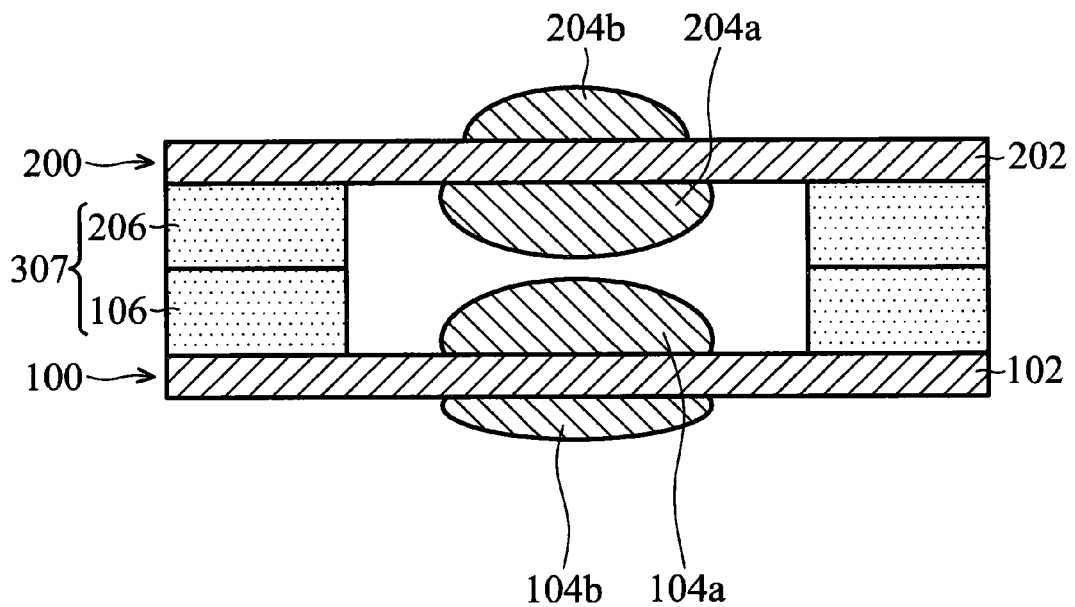

Referring to FIG. 5, additional lenses 104b and 204b are optionally formed on the transparent substrates 102 and 202, respectively. In the embodiment shown in FIG. 5, the transparent substrate 102 is between the lenses 104a and 104b. Similarly, the transparent substrate 202 is between the lenses 204a and 204b. The lenses 104b and 204b may also be formed by a lens mounting process. The additionally formed lenses 104b and 204b may facilitate accurate and precise focus.

Figure 6:
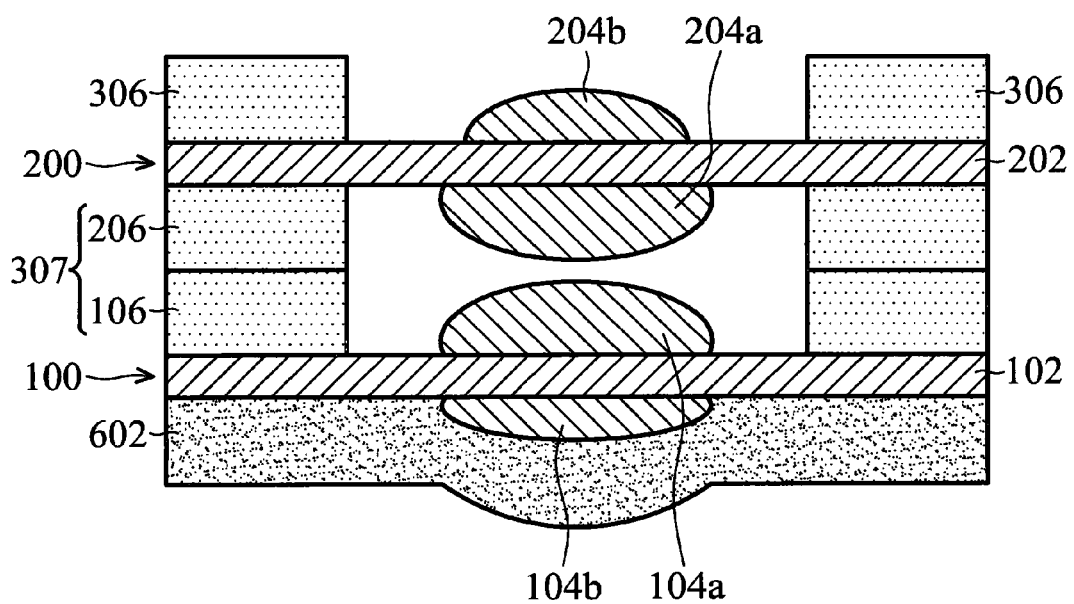
Figure 7:
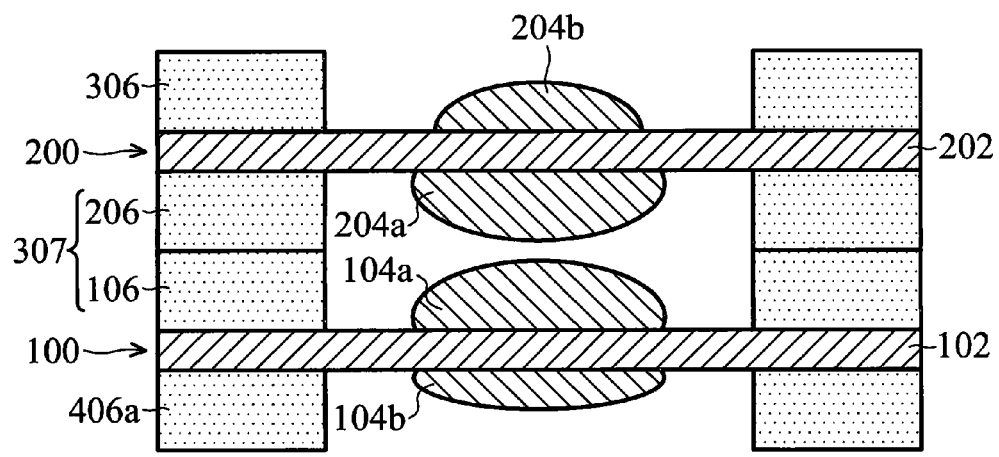
Figure 8:
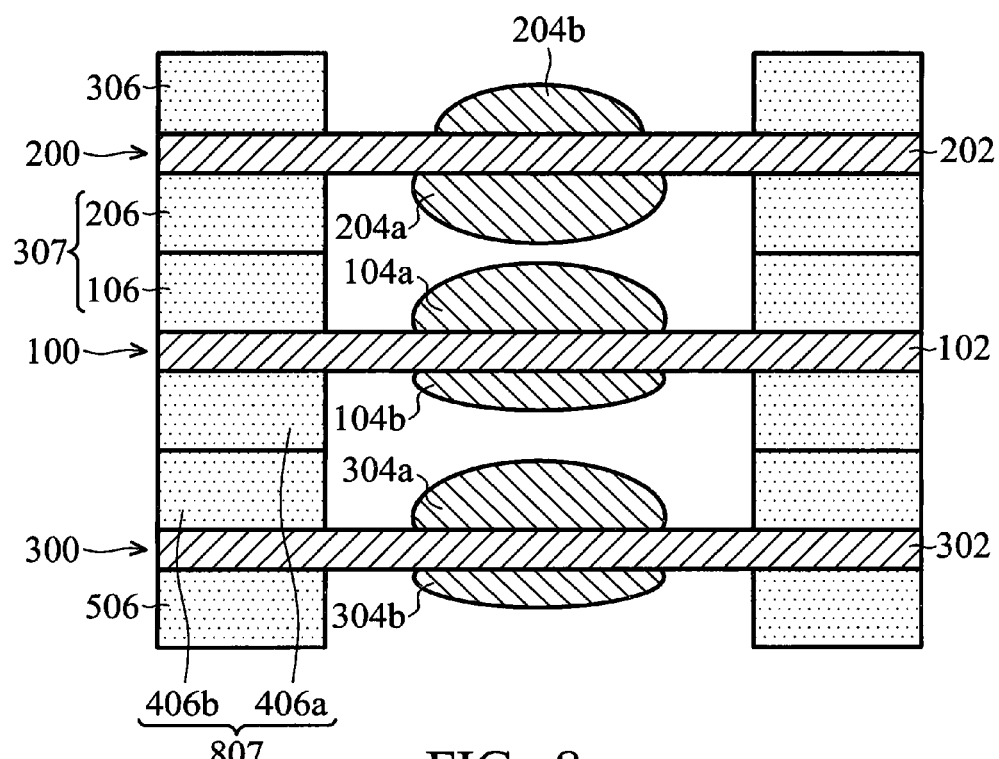

As shown in FIGS. 6-8, an additional lens layer may be optionally stacked on the lens layer 100 or the lens layer 200. As shown in FIG. 6, a removable protecting layer 602 is first formed overlying the lens layer 100 to protect the lens 104b. Then, a spacer layer 306 is formed on the transparent substrate 202 of the lens layer 200. The spacer layer 306 may be used to bond with other structure, such as another lens layer or another optical element.

Referring to FIG. 7, after the spacer layer 306 is formed, the protecting layer 602 is removed and a spacer layer 406a is formed on the transparent substrate 102 of the lens layer 100. The spacer layer 406a may be used to bond with another lens layer as shown in FIG. 8. Alternatively, the spacer layer 406a may be used to bond with an image sensor chip as shown in FIG. 9.

Referring to FIG. 8, a lens layer 300 having a transparent substrate 302 and lenses 304a and 304b is provided. Spacer layers 406b and 506 are formed on the transparent substrate 302 of the lens layer 300. The spacer layers 406a and 406b include similar material used in the spacer structure 307. Thus, the spacer layers 406a and 406b are directly bonded together to form a spacer structure 807. Similarly, a rework process may be performed if the stacking of the lens layer 100 and 300 fails. After the alignment and the stacking of the lens layers 100 and 300 are successfully achieved, a curing process may be performed to harden the spacer structure 807. Similarly, the spacer structure 807 does not contact with any adhesive.

Figure 9:
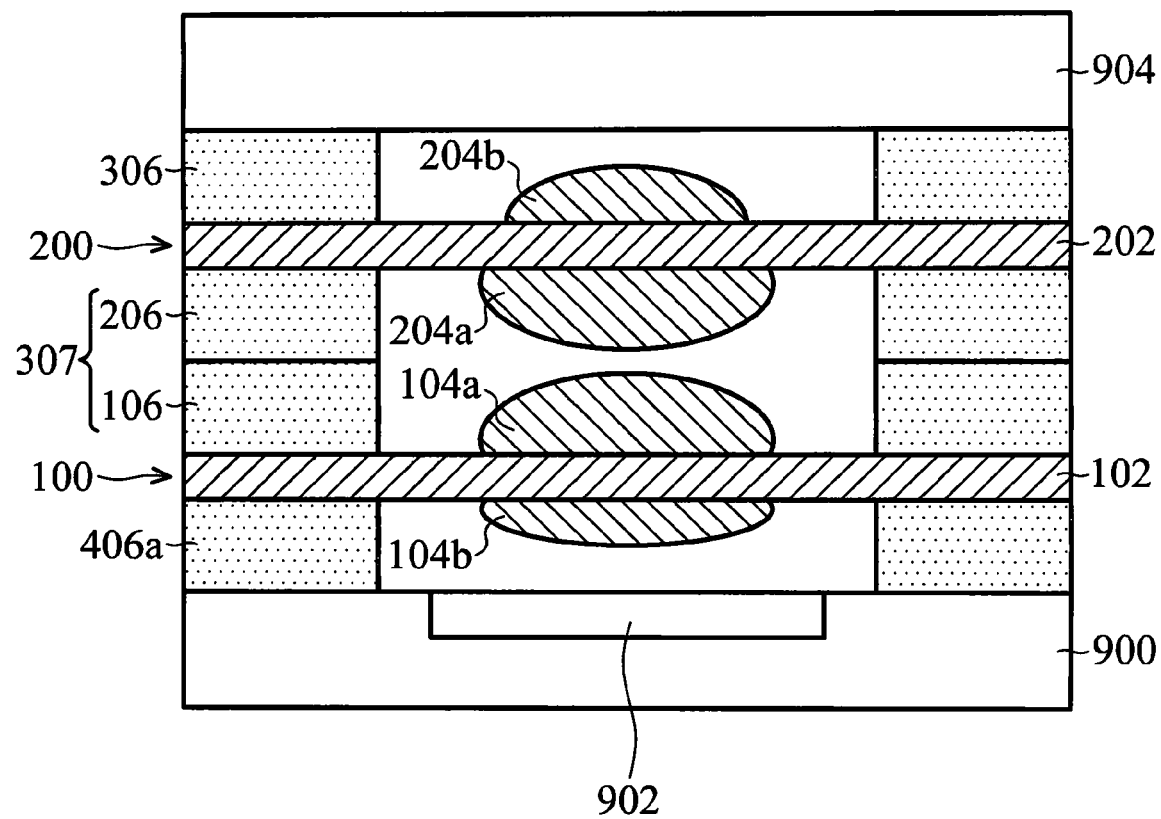
FIG. 9 is a cross-sectional view showing an image sensor module including a lens assembly in accordance with an embodiment of the present invention.

Referring to FIG. 9, in another embodiment of the invention, the lens assembly including the lens layers 100 and 200 is disposed on an image sensor chip 900 through the spacer layer 406a. The image sensor chip 900 includes an image capturing zone 902. A protecting cover 904 is placed on the lens layer 200 through the spacer layer 306. The protecting cover 904 may include, but is not limited to, a glass substrate or a quartz substrate.

As shown in FIG. 9, the distance between the lenses may be adjusted through the thinning of the transparent substrate or the forming of the spacer structure. Thus, the focal length of the lens assembly can be accurately and precisely controlled, improving the image projection quality of the lens assembly. Since the quality of the image projection of the optical lens assembly is improved, the image signal processed by the image sensor chip 900 is also advanced. In addition, due to the reworkable characteristic of the spacer structure, the line yield of the lens assembly is further improved. Additionally, in one embodiment, the lens assembly is formed in a wafer level process. Thus, the focal length adjustment is also conducted during the wafer level process. The manufacturing cost and time are therefore significantly reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a lens assembly, comprising:
   providing a first lens layer having a first transparent substrate and a first lens on the first transparent substrate;
   providing a second lens layer having a second transparent substrate and a second lens on the second transparent substrate;
   stacking the first lens layer on the second lens layer;
   forming a spacer structure between the first lens layer and the second lens layer; and
   after the spacer structure is formed, thinning the first transparent substrate to a first thickness,
   wherein the forming of the spacer structure comprises:
   forming a first spacer layer directly on the first transparent substrate;
   forming a second spacer layer directly on the second transparent substrate; and
   stacking the first lens layer on the second lens layer to directly bond the first spacer layer with the second spacer layer, wherein the first spacer layer and the second spacer layer together form the spacer structure, and each of the first spacer layer and the second spacer layer comprises a clinging polymer material.

2. The method for forming a lens assembly as claimed in claim 1, further comprising thinning the second transparent substrate to a second thickness after the first spacer is formed.

3. The method for forming a lens assembly as claimed in claim 1, further comprising curing the first spacer layer and the second spacer layer after the first spacer layer and the second spacer layer are directly bonded.

4. The method for forming a lens assembly as claimed in claim 3, wherein the first spacer layer and the second spacer layer are removable before the curing of the first spacer layer and the second spacer layer.

5. The method for forming a lens assembly as claimed in claim 4, wherein each of the first spacer layer and the second spacer layer comprises Epoxy resin, Silicone resin, Acrylic resin, photo initiator, or combinations thereof.

6. The method for forming a lens assembly as claimed in claim 1, further comprising forming a third lens on the first transparent substrate.

7. The method for forming a lens assembly as claimed in claim 6, wherein the first transparent substrate is between the first lens and the third lens.

8. The method for forming a lens assembly as claimed in claim 1, further comprising:
   providing a third lens layer having a third transparent substrate and a third lens on the third transparent substrate; and
   stacking the third lens layer on the first lens layer or the second lens layer.

9. A lens assembly, comprising:
   a first lens layer having a first transparent substrate and a first lens on the first transparent substrate;
   a second lens layer having a second transparent substrate and a second lens on the second transparent substrate; and
   a first spacer structure between the first lens layer and the second lens layer, wherein the spacer structure directly contacts with the first transparent substrate and the second transparent substrate, the first spacer structure comprises a clinging polymer material, and the first spacer structure comprises a fixed bonding interface between the first transparent substrate and the second transparent substrate.

10. The lens assembly as claimed in claim 9, wherein the first spacer structure comprises a polymer material.

11. The lens assembly as claimed in claim 10, wherein the first spacer structure comprises Epoxy resin, Silicone resin, Acrylic resin, photo initiator, or combinations thereof.

12. The lens assembly as claimed in claim 9, wherein the first spacer structure does not contact with any adhesive.

13. The lens assembly as claimed in claim 9, wherein the first transparent substrate has a thickness other than that of the second transparent substrate.

14. The lens assembly as claimed in claim 9, further comprising a third lens on the first transparent substrate.

15. The lens assembly as claimed in claim 14, wherein the first transparent substrate is between the first lens and the third lens.

16. The lens assembly as claimed in claim 9, further comprising a third lens layer disposed on the first lens layer.

17. The lens assembly as claimed in claim 16, further comprising a second spacer structure between the first lens layer and the third lens layer.

18. The lens assembly as claimed in claim 17, wherein the second spacer structure directly contacts with the third lens layer and the first transparent substrate.

* * * * *